(12) United States Patent
Kaji et al.

(10) Patent No.: US 7,468,304 B2
(45) Date of Patent: Dec. 23, 2008

(54) METHOD OF FABRICATING OXIDE SEMICONDUCTOR DEVICE

(75) Inventors: Nobuyuki Kaji, Kawasaki (JP); Hisato Yabuta, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 74 days.

(21) Appl. No.: 11/466,950

(22) Filed: Aug. 24, 2006

(65) Prior Publication Data

US 2007/0054507 A1    Mar. 8, 2007

(30) Foreign Application Priority Data

Sep. 6, 2005   (JP) .............................. 2005-258268

(51) Int. Cl.
*H01L 21/336* (2006.01)
(52) U.S. Cl. ...................... 438/308; 438/149
(58) Field of Classification Search ................ 438/308, 438/149; 257/E29.151
See application file for complete search history.

(56) References Cited

U.S. PATENT DOCUMENTS

| | | | |
|---|---|---|---|
| 7,061,014 B2 | 6/2006 | Hosono et al. | 257/43 |
| 7,189,992 B2 | 3/2007 | Wager, III et al. | 257/43 |
| 2003/0021822 A1 | 1/2003 | Lloyd | 424/423 |
| 2003/0168004 A1* | 9/2003 | Nakata et al. | 118/50.1 |
| 2006/0197092 A1* | 9/2006 | Hoffman et al. | 257/72 |
| 2007/0010052 A1* | 1/2007 | Huang et al. | 438/199 |
| 2007/0087492 A1* | 4/2007 | Yamanaka | 438/166 |
| 2007/0141789 A1* | 6/2007 | Kiesel et al. | 438/282 |
| 2007/0194379 A1* | 8/2007 | Hosono et al. | 257/347 |

FOREIGN PATENT DOCUMENTS

| | | |
|---|---|---|
| JP | 62-001245 A | 1/1987 |
| JP | 62-007166 A | 1/1987 |
| JP | 1-287965 A | 11/1989 |
| JP | 2-205324 A | 8/1990 |
| JP | 2002-76356 | 3/2002 |
| JP | 2004-103957 A | 4/2004 |
| WO | WO 2005/088726 | 9/2005 |
| WO | WO 2005/093846 A1 | 10/2005 |
| WO | WO 2005/093847 A1 | 10/2005 |
| WO | WO 2005/093848 A1 | 10/2005 |
| WO | WO 2005/093849 A1 | 10/2005 |
| WO | WO 2005/093850 A1 | 10/2005 |
| WO | WO 2005/093851 A1 | 10/2005 |
| WO | WO 2005/093852 A1 | 10/2005 |

OTHER PUBLICATIONS

K. Nomura et al., "Room-temperature fabrication of transparent flexible thin-film transistors using amorphous oxide semiconductors", Nature, vol. 432, Nov. 25, 2004, pp. 488-492.

T. Akihiro et al., "Carrier transport and electronic structure in amorphous oxide semiconductor, a-InGaZnO$_4$", Thin Solid Films, vol. 486, 2005, pp. 38-41.

* cited by examiner

*Primary Examiner*—Thao P. Le
(74) *Attorney, Agent, or Firm*—Fitzpatrick, Cella, Harper & Scinto

(57) ABSTRACT

A method for fabricating a device using an oxide semiconductor, including a process of forming the oxide semiconductor on a substrate and a process of changing the conductivity of the oxide semiconductor by irradiating a predetermined region thereof with an energy ray.

6 Claims, 5 Drawing Sheets

US 7,468,304 B2

METHOD OF FABRICATING OXIDE SEMICONDUCTOR DEVICE

BACKGROUND OF THE INVENTION

1. Field of the Invention

The present invention relates to methods of fabricating semiconductor devices using oxide semiconductors. More specifically, the present invention relates to methods of fabricating field-effect transistors (FETs) using oxide semiconductors as channels.

2. Description of the Related Art

Recently, transistors having channel layers formed of transparent films have been developed by using electrically conductive oxide thin films. For example, a thin-film transistor (TFT) using a channel layer formed of a transparent conductive oxide polycrystalline thin film containing ZnO as the main component is disclosed in Japanese Patent Laid-Open No. 2002-76356. The above-mentioned thin film can be formed at a low temperature and is transparent to visible light. Therefore, a flexible transparent TFT can be fabricated on a substrate such as a plastic sheet or film.

As disclosed in the First Embodiment of Japanese Patent Laid-Open No. 2002-76356, a drain and a source of an oxide TFT are usually formed of a transparent conductive material, a metal, or a highly doped semiconductor which is different from that of an oxide-semiconductor channel layer. The drain and the source are formed on the top or bottom face of the oxide-semiconductor channel. As an example of such structures, FIG. 8 shows a structure of an inverted-staggered (bottom-gate) TFT.

With reference to FIG. 8, a TFT is configured with a substrate 81, a gate electrode 82 disposed on the substrate 81, a gate-insulating film 83 disposed on the gate electrode 82, a channel layer 84 of an oxide semiconductor disposed on the gate-insulating film 83, and a drain 85 and a source 86 disposed on the channel layer 84. The drain 85 and the source 86 are formed of a metal, a conductive oxide, or a highly doped semiconductor.

The transistor operation of the TFT is performed by applying a voltage to the gate electrode 82 to accumulate or deplete charge at the interface between the gate-insulating film 83 and the channel layer 84 and thereby to change the current value between the drain 85 and the source 86. In this TFT, the drain 85 and the source 86 are disposed on one side of the channel layer 84, and the gate-insulating film 83 is disposed on the other side of the channel layer 84. In other words, the drain 85 and the channel layer 84 are not directly connected to the effective current path for the transistor operation, i.e., the interface between the gate-insulating film 83 and the channel layer 84. Therefore, when a current flows between the drain 85 and the source 86 through the interface between the gate-insulating film 83 and the channel layer 84, the current must flow disadvantageously through unnecessary resistance.

FIG. 9 shows a structure of a staggered (top-gate) TFT.

With reference to FIG. 9, a TFT is configured with a substrate 91, a channel layer 94 disposed on the substrate 91, a drain 95 and a source 96 formed of a metal, a conductive oxide, or a highly doped semiconductor disposed on the channel layer 94, a gate-insulating film 93 disposed so as to bridge the gap between the drain 95 and the source 96, and a gate electrode 92 disposed on the gate-insulating film 93.

The transistor operation of this TFT is similarly performed by applying a voltage to the gate electrode 92 to accumulate or deplete charge at the interface between the gate-insulating film 93 and the channel layer 94 and thereby to change the current value between the drain 95 and the source 96. In a structure with microscopic asperities as in this structure, it is very difficult to completely fill the gap and difference in level between the drain 95 and the source 96 with the gate-insulating film 93. Thus, gaps unavoidably occur near the drain 95 and the source 96, as shown in FIG. 9. Therefore, the interface between the channel layer 94 and the gate-insulating film 93 is not flat, thereby forming a structure with curvature or inequalities which is a factor in degradation of the interface properties.

In addition, if the drain 95 and the source 96 are formed into appropriate shapes by etching, the etching liquid, etching gas, or plasma corrodes the surface of the channel layer 94. If they are processed by lift-off, a resist and an organic solvent pollute the surface of the channel layer 94. Therefore, the interface between the channel layer 94 and the gate-insulating film 93 cannot be maintained at favorable conditions, and thereby the characteristics of the thin-film transistor are degraded, which is a problem.

In order to solve such problems, transistors are desired to have a structure described in the fourth embodiment in Japanese Patent Laid-Open No. 2002-76356. FIG. 10 shows the structure of such transistors.

With reference to FIG. 10, a TFT is configured with a substrate 101, a channel layer 104 disposed on the substrate 101, a gate-insulating film 103 disposed on the channel layer 104, a gate electrode 102 disposed on the gate-insulating film 103, and a drain 105 and a source 106 formed in the channel layer 104. The drain 105 and the source 106 are formed by decreasing the resistance of the channel layer 104 at both sides of the gate-insulating film 103 being in contact with the channel layer 104.

The structure of the transistor shown in FIG. 10 does not have unnecessary resistance between the drain 105 and the channel layer 104 and between the source 106 and the channel layer 104, unlike the structures shown in FIGS. 8 and 9. The drain 105 and the source 106 are in direct contact with the interface between the channel layer 104 and the gate-insulating film 103. Furthermore, no gaps and distortion in shape occur in the interface between the channel layer 104 and the gate-insulating film 103, and thus the favorable interface properties can be maintained. In addition, the interface between the channel layer 104 and the gate-insulating film 103 is not corroded with the etching liquid, gas, or plasma, or the resist and organic solvent, and thereby the drain 105 and the source 106 can be formed without degradation of the favorable interface properties. Thus, in the structure shown in FIG. 10, the problems in the structures of the transistors shown in FIGS. 8 and 9 can be solved.

However, when a transistor having a structure shown in FIG. 10 is fabricated according to the technology disclosed in Japanese Patent Laid-Open No. 2002-76356, part of the channel layer is formed by doping such as solid-phase diffusion of an impurity, ion implantation, or plasma doping. Therefore, an ion implantation apparatus having an accelerator or a plasma device for doping is necessary. In addition, a heating process of equalizing the doping is necessarily conducted. When an oxide semiconductor is used as the channel layer, heating at a high temperature must be conducted for a long period of time because the diffusion coefficient of an impurity in an oxide is lower than that in silicon.

As mentioned above, such use of large apparatuses disadvantageously causes an increase in the cost. In addition, the oxide semiconductor is crystallized or recrystallized by the treatment at a high temperature, and thereby the surface shape of the oxide-semiconductor channel layer is deformed. Furthermore, reaction and diffusion occur between the oxide-semiconductor channel layer and the gate-insulating film, and thereby the interface between the channel layer and the gate-insulating film is degraded. Even if these problems would not occur, the heating at a high temperature for a long period of time is highly troublesome in transistor manufacturing and increases the manufacturing cost.

The present invention provides high-quality and high-performance devices at low costs by solving the above-mentioned problems in methods for manufacturing oxide-semiconductor devices such as field-effect transistors (FETs) using oxide-semiconductors as channels.

SUMMARY OF THE INVENTION

The present invention provides a method for fabricating a device using an oxide semiconductor, and effectively solves the above-mentioned problems. The method includes a process of forming an oxide semiconductor on a substrate and a process of changing the conductivity of the oxide semiconductor by irradiating a predetermined region of the oxide semiconductor with an energy ray.

In the present invention, the process of changing the conductivity of an oxide semiconductor may be performed by increasing the conductivity of the oxide semiconductor by irradiating the predetermined region with light having a wavelength equal to or greater than the band-gap energy of the oxide semiconductor. In this case, the device is an oxide-semiconductor channel field-effect transistor. The region where the conductivity is increased may a source and a drain being in contact with the channel of the field-effect transistor. Furthermore, the irradiated light used for increasing the conductivity of the oxide semiconductor may be an X-ray with a shortest wavelength of 0.15 nm or less. In addition, the irradiated light may be a particle beam such as an electron beam with a shortest wavelength of 0.15 nm or less. The oxide semiconductor may contain at least one element selected from zinc, indium, and gallium as the constituent element.

By irradiation with an X-ray having a wavelength of 0.15 nm or less or an electron beam having a wavelength of 0.15 nm or less, defects are formed in the irradiated region of the oxide semiconductor, and carriers are generated in the oxide semiconductor by the defects. As a result, a drain and a source having a high conductivity can be formed in the oxide semiconductor which has a low conductivity. In addition, since the drain and the source having a high conductivity are formed in the oxide semiconductor, unnecessary resistance does not occur between the drain and the channel layer and between the source and the channel layer, unlike the structure shown in FIG. 8.

In the present invention, the process of changing the conductivity of the oxide semiconductor may include a step for bringing a photocatalyst into contact with a predetermined region of the oxide semiconductor. In addition, the conductivity of the oxide semiconductor may be decreased by irradiating the photocatalyst with light having an energy equal to or greater than the optical band-gap of the photocatalyst.

In such a case, the above-mentioned device is an oxide-semiconductor channel field-effect transistor using an oxide semiconductor as a channel layer. The region for decreasing the conductivity of the oxide semiconductor may be the channel layer in the region between a source and a drain of the field-effect transistor. The irradiated light used for decreasing the conductivity of the oxide semiconductor may be ultraviolet light. The primary component of the irradiated light used for decreasing the conductivity of the oxide semiconductor may have a wavelength shorter than the band-gap of the photocatalyst. The photocatalyst to be brought into contact with the oxide semiconductor in the process of decreasing the conductivity of the oxide semiconductor may be a material containing titanium oxide, or may be a photocatalyst mask processed into a predetermined shape on a substrate. An exemplary substrate is a glass substrate. The oxide semiconductor may contain at least one element selected from zinc, indium, and gallium as a constituent element.

When the present invention is applied to a method for fabricating an FET using an oxide semiconductor as the channel layer, a drain and a source are formed in the oxide semiconductor so as to have a conductivity higher than that of the channel layer. Therefore, no gaps are generated between the channel layer and the insulating film, unlike the structure shown in FIG. 9. In addition, no distortion occurs.

In the present invention, heating after the irradiation of an X-ray or an electron beam is unnecessary. Therefore, distortion of the surface shape, reaction and diffusion between the oxide-semiconductor channel layer and the gate-insulating film, and degradation of the interface, which are caused by heating at a high temperature, do not occur. In addition, there is no increase in the cost.

The present invention allows the source and the drain to be formed without using etching and lift-off processes, and the interface between the channel layer and the gate-insulating film is not degraded.

Therefore, in a case that the present invention is applied to a method for fabricating an FET using an oxide semiconductor as a channel layer, a process is provided for forming a drain and a source at low cost, while maintaining the favorable properties of the interface between the channel layer and the gate-insulating film.

According to the present invention, in a common semiconductor device such as an FET using an oxide semiconductor, mutual diffusion of materials at an interface between the device-constituting layers can be suppressed and the favorable conditions and the shape of the interface can be maintained.

According to the present invention, in a method for fabricating a device using an oxide semiconductor, a low-cost process for forming a region having an electrical conductivity different from that of the oxide semiconductor can be provided.

Further features of the present invention will become apparent from the following description of exemplary embodiments with reference to the attached drawings.

DESCRIPTION OF THE EMBODIMENTS

Embodiments for performing a method of fabricating an oxide-semiconductor device according to the present invention will now be specifically described with reference to the drawings.

First Embodiment

A method for fabricating an oxide-semiconductor device according to a First Embodiment of the present invention, specifically, a method for fabricating an FET using an oxide-semiconductor as a channel will now be described with reference to FIGS. 1 to 3. At first, the constitution of an FET device will be described with reference to the FET structure shown in FIG. 1.

Figure 1:
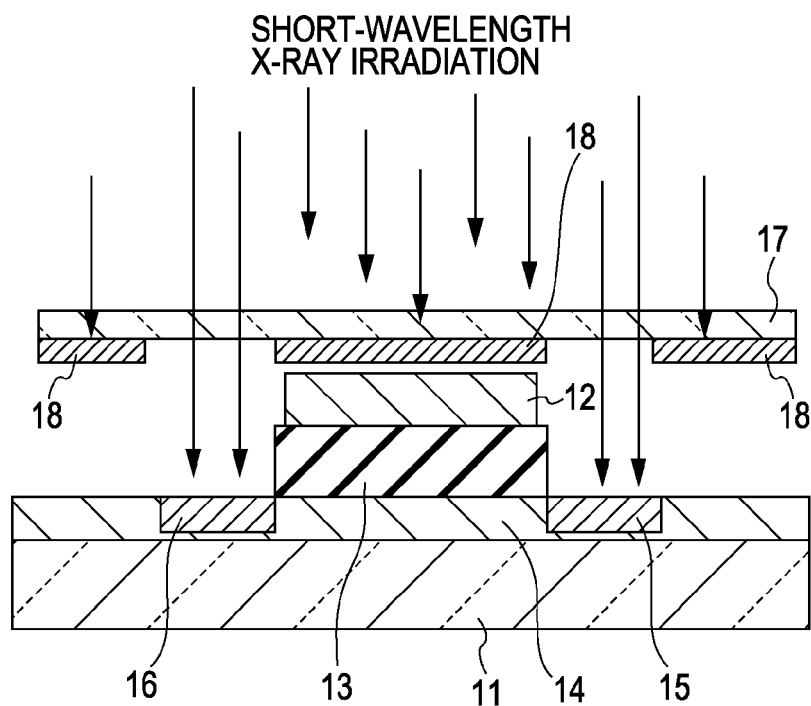
FIG. 1 is a schematic diagram of a top-gate thin-film transistor for illustrating a method for fabricating an oxide-semiconductor device according to a First Embodiment and EXAMPLE 1 of the present invention. A drain and a source are formed in a channel layer by X-ray irradiation through a mask.

In the FET shown in FIG. 1, an oxide semiconductor for the channel layer 14 may be formed of an oxide of which the primary constituent is ZnO, $In_2O_3$, or $Ga_2O_3$. In addition, the oxide semiconductor may be formed of an oxide mixture containing at least two of ZnO, $In_2O_3$, and $Ga_2O_3$ as the primary constituent. In particular, an oxide containing $In_2O_3$ and ZnO at a total molecular ratio of 50% or more is preferred. The present inventors have observed that these materials have excellent characteristics as an oxide semiconductor and of which conductivity is efficiently increased by irradiation with light or a particle beam. In addition, the channel layer may contain an oxide semiconductor such as $SnO_2$, $TiO_x$, or another oxide semiconductor.

The oxide semiconductor may be crystalline or amorphous. The device may have a common FET constitution fabricated by using an oxide semiconductor in bulk as a substrate and forming a drain, a source, a gate-insulating film, and a gate electrode thereon. In addition, the device may have a thin-film transistor (TFT) constitution fabricated by forming an oxide semiconductor film, a drain, a source, a gate-insulating film, and a gate electrode on a substrate. The TFT may have either an inverted-staggered (bottom-gate) or staggered (top-gate) structure.

The gate-insulating film 13 may be formed of a film containing a silicon oxide or nitride such as $SiO_2$, $SiN_x$, or $SiO_xN_y$. These materials are known to be highly insulative and can be suitably used as gate-insulating films. In addition, the gate-insulating film 13 may be formed of a metal oxide such as $Al_2O_3$, $TiO_2$, $ZrO_2$, $HfO_2$, $Nb_2O_5$, $Ta_2O_5$, $Sc_2O_3$, $Y_2O_3$, or a rare-earth metal oxide. These materials are known to have a relatively high dielectric constant and can induce a large amount of charge to the interface of the gate-insulating film by applying a low voltage.

The gate electrode 12 may be formed of a metal film of Au or Al. An electrically conductive oxide film such as a Sn-doped $In_2O_3$ (indium-tin oxide: ITO) film may be used. In addition, a semiconductor such as highly doped polysilicon may be used.

Processes for forming each component will now be described. The oxide semiconductor used as the channel layer 14 of the FET may be formed as a thin film by sputtering, such as radio frequency (RF) magnetron sputtering. Deposition, for example, electron-beam deposition, laser deposition, or deposition employing resistance heating, may be conducted. In addition, a chemical vapor deposition (CVD) method such as a plasma CVD method or a solution-coating method such as a sol-gel method may be conducted. These methods can be also employed for forming gate-insulating films or electrodes.

The bulk oxide semiconductor may be prepared as an amorphous oxide sheet by rapidly cooling a melted oxide while drawing it into a sheet-like shape. In addition, the oxide semiconductor may be prepared as an oxide-semiconductor crystal wafer by forming a crystal ingot by inserting a seed crystal into a melted oxide and slowly extracting the seed crystal so that the crystal grows, and by cutting the ingot at desired crystal faces into wafers.

The drain 15 and the source 16 can be each formed in a predetermined region of the oxide semiconductor as the channel layer 14 by irradiating the region with light or a particle beam having a wavelength shorter than the band-gap energy of the oxide semiconductor. This is based on the fact that oxygen defects are generated by irradiating the oxide semiconductor with light or a particle beam having a short wavelength, thereby carrier electrons are generated in the oxide semiconductor, and the electrical conductivity of the semiconductor is increased. This effect is equivalent to an increase of the carrier electrons in doping of a semiconductor with an n-type dopant.

The oxide semiconductor may be irradiated with an X-ray for efficiently forming highly conductive regions, namely, the drain 15 and the source 16 of the FET. In particular, an X-ray containing a primary component having a wavelength of 1.5 nm or less is preferred. In addition, the oxide semiconductor may be irradiated with an electron beam as the particle beam for efficiently forming highly conductive regions, namely, the drain 15 and the source 16 of the FET. In particular, an electron beam containing a primary component having a wavelength of 1.5 nm or less is preferred.

In order to irradiate only a predetermined region of the oxide semiconductor with light for increasing the conductivity of the region in the oxide semiconductor, a mask 18 as shown in FIG. 1 may be used. The mask 18 is made of a material substantially impervious to the irradiated light and is processed on a mask substrate 17 into a desired shape.

The mask may be formed of a material containing a heavy element such as lead, tungsten, tantalum, or bismuth. These materials containing a heavy element are highly impervious to short-wavelength light, in particular, to an X-ray, compared to other materials. Therefore, these materials are suitable as the mask. In addition, materials containing another element may be used by thickening the mask to decrease the transmission of light.

Figure 2:
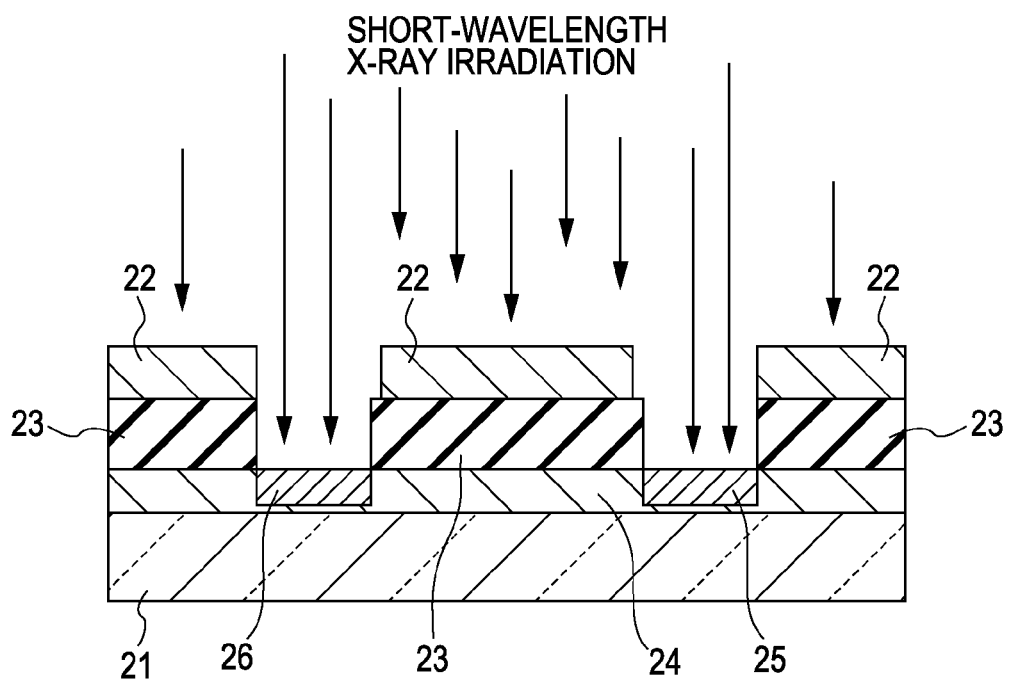
FIG. 2 is a schematic diagram of a top-gate thin-film transistor for illustrating a method for fabricating an oxide-semiconductor device according to the First Embodiment and EXAMPLES 2 and 3 of the present invention. A drain and a source are formed in a channel layer by X-ray irradiation without using a mask.

As shown in FIG. 2, the highly conductive region may be prepared by forming a film substantially impervious to irradiated light on an oxide semiconductor, removing the film in a predetermined region by etching, and irradiating the oxide semiconductor with light. In an FET, a gate-insulating film 23 or a lamination of a gate-insulating film 23 and a gate electrode 22 is formed on the channel layer 24 of an oxide semiconductor. Then, a drain 25 and a source 26 are formed by removing the film formed on the oxide semiconductor only in regions where the drain 25 and the source 26 are to be formed, and irradiating the oxide semiconductor with light.

In order to irradiate only a predetermined region of the oxide semiconductor with a particle beam for increasing the conductivity of the region in the oxide semiconductor, the following method may be performed. When a particle beam with a large width is obtained from a particle beam accelerator, a mask 18 as shown in FIG. 1 may by used. The mask 18 is made of a material substantially impervious to the irradiated particle beam and is processed on a mask substrate 17 into a desired shape. In addition, as shown in FIG. 2, the highly conductive region may be prepared by forming a film substantially impervious to irradiated light on the oxide semiconductor, removing the film in a predetermined region by etching, and irradiating the oxide semiconductor with light.

Figure 3:
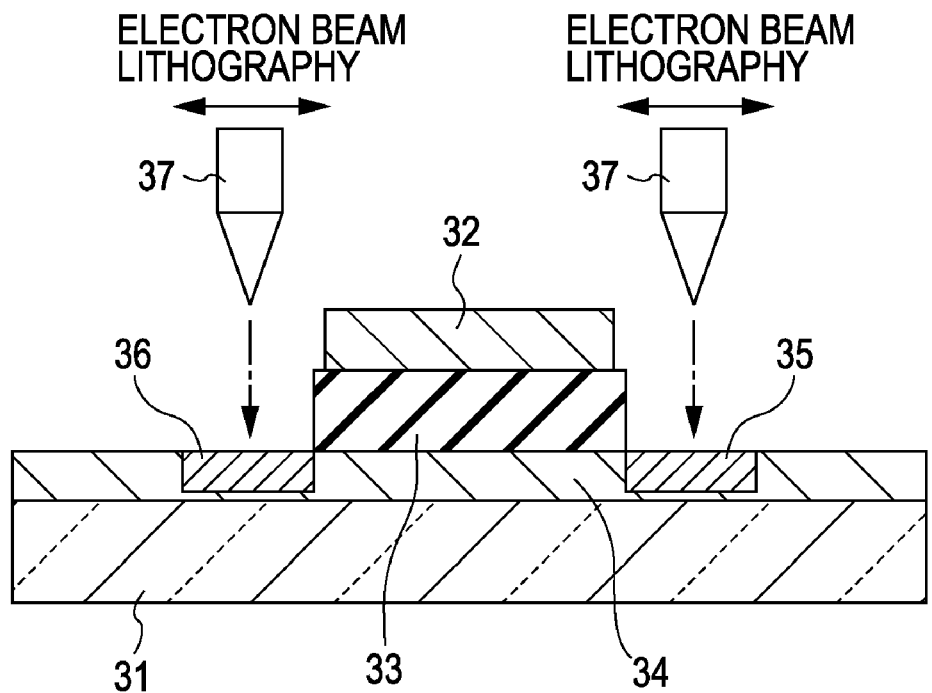
FIG. 3 is a schematic diagram of a top-gate thin-film transistor for illustrating a method for fabricating an oxide-semiconductor device according to the First Embodiment and EXAMPLES 4 and 5 of the present invention. A drain and a source are formed in a channel layer by electron beam lithography.

When the particle beam is an electron beam obtained from a field-emission electron source, highly conductive regions, namely, the domain 35 and the source 36 may be formed by scanning the electron beam gun 37 as shown in FIG. 3 and irradiating the predetermined region of the oxide semiconductor as the channel layer 34.

After the formation of the drain and the source, the following processes may be further conducted for readily achieving wiring and probe contacting. That is, a drain electrode and a source electrode which are connected to the drain and the source, respectively, may be formed on the drain and the source, respectively. The drain and source electrodes may be formed of a metal film such as Au or Al or a conductive oxide film such as Sn-doped $In_2O_3$ (ITO). In addition, a semiconductor such as highly doped polysilicon may be used.

Thus, a device using an oxide semiconductor, in particular, an FET using an oxide semiconductor as a channel, which has high quality and high performance, can be provided at low cost by fabricating the device according to the First Embodiment of the present invention.

Second Embodiment

A method for fabricating an oxide-semiconductor device according to a Second Embodiment of the present invention, specifically, a method for fabricating an FET using an oxide-semiconductor as a channel will now be described with reference to FIGS. 4 to 7. At first, the constitution of an FET will be described with reference to the FET structure shown in FIG. 4.

Figure 4:
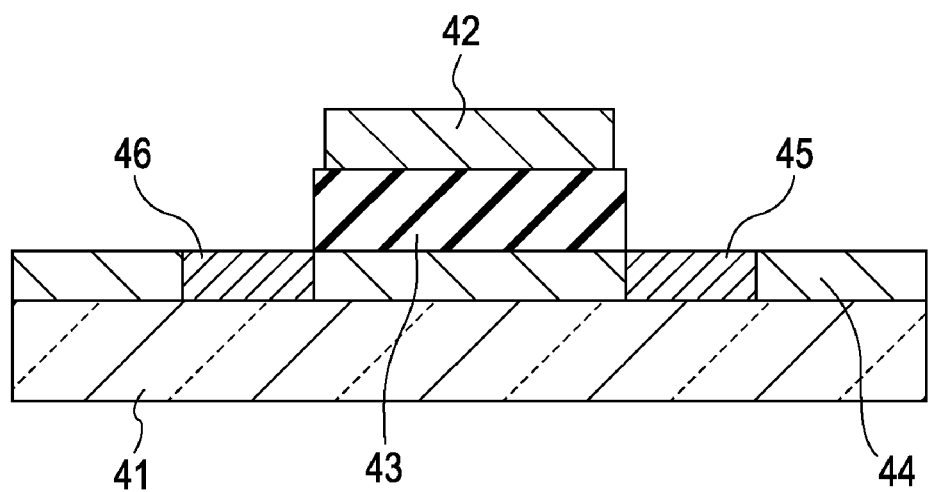
FIG. 4 is a schematic diagram of a top-gate thin-film transistor for illustrating a method for fabricating an oxide-semiconductor device according to a Second Embodiment and EXAMPLES 6, 8, and 9 of the present invention.

In the FET device shown in FIG. 4, the oxide semiconductor for the channel layer 44 may be formed of an oxide of which the primary constituent is ZnO, $In_2O_3$, or $Ga_2O_3$. In addition, the oxide semiconductor may be formed of an oxide mixture containing at least two of ZnO, $In_2O_3$, and $Ga_2O_3$ as the primary constituent. In particular, an oxide containing $In_2O_3$ and ZnO at a total molecular ratio of 50% or more is preferred. The channel layer may contain an oxide semiconductor such as $SnO_2$, $TiO_x$, or another oxide semiconductor. In addition, the channel layer may be crystalline or amorphous.

When the desired device is an FET, a thin-film oxide semiconductor is preferred. The constitution of the FET may be a thin-film transistor (TFT) fabricated by forming an oxide semiconductor thin film, a drain, a source, a gate-insulating film, and a gate electrode on a substrate. The TFT may have either an inverted-staggered (bottom-gate) or staggered (top-gate) structure. When the device is not the FET, the oxide semiconductor may be a thin film or a bulk device such as a wafer, depending on the purpose of use.

The oxide semiconductor film is uniformly deposited on the substrate so as to provide a conductivity required for the drain 45 and the source 46 by controlling the amount of oxygen during the film-forming process. The deposition may be conducted by sputtering such as RF magnetron sputtering. Deposition, for example, electron-beam deposition, laser deposition, or deposition employing resistance heating, may be conducted. In addition, a CVD method such as a plasma CVD method or a solution-coating method such as a sol-gel method may be conducted.

Then, a photocatalyst is brought into contact with or approximated to the oxide semiconductor in a region where the drain 45 and the source 46 are not to be formed. The photocatalyst is irradiated with light to oxidize the oxide semiconductor in that region, and thereby the conductivity of the region is decreased. This is based on the fact that oxygen defects behave as an n-type dopant in an oxide semiconductor. In other words, the oxidization of the oxide semiconductor with a photocatalyst, namely, the compensation of the oxygen defects, is equivalent to a decrease of the dopant in the semiconductor. That is, the carrier density in the semiconductor is decreased to an amount suitable for the channel of the FET by oxidizing the predetermined region of the oxide semiconductor. The thus oxidized region is used as the channel layer 44. The non-oxidized region still has a high conductivity suitable as a drain and a source and therefore can be used as the drain and the source of the FET.

Figure 5:
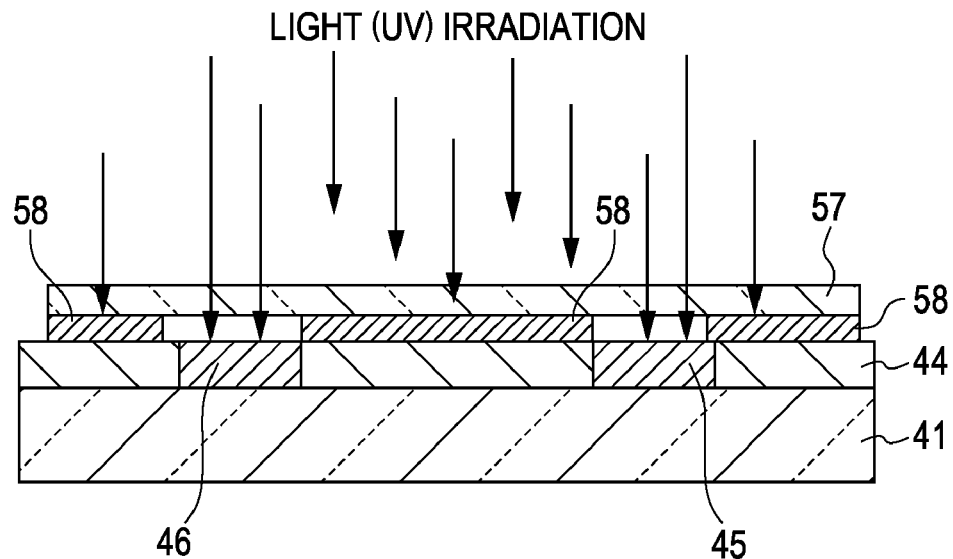
FIG. 5 is a schematic diagram for illustrating a method for fabricating an oxide-semiconductor device according to the Second Embodiment and EXAMPLES 6 and 7 of the present invention. A drain and a source are formed in an oxide semiconductor by a photocatalyst mask and light irradiation.
Figure 6:
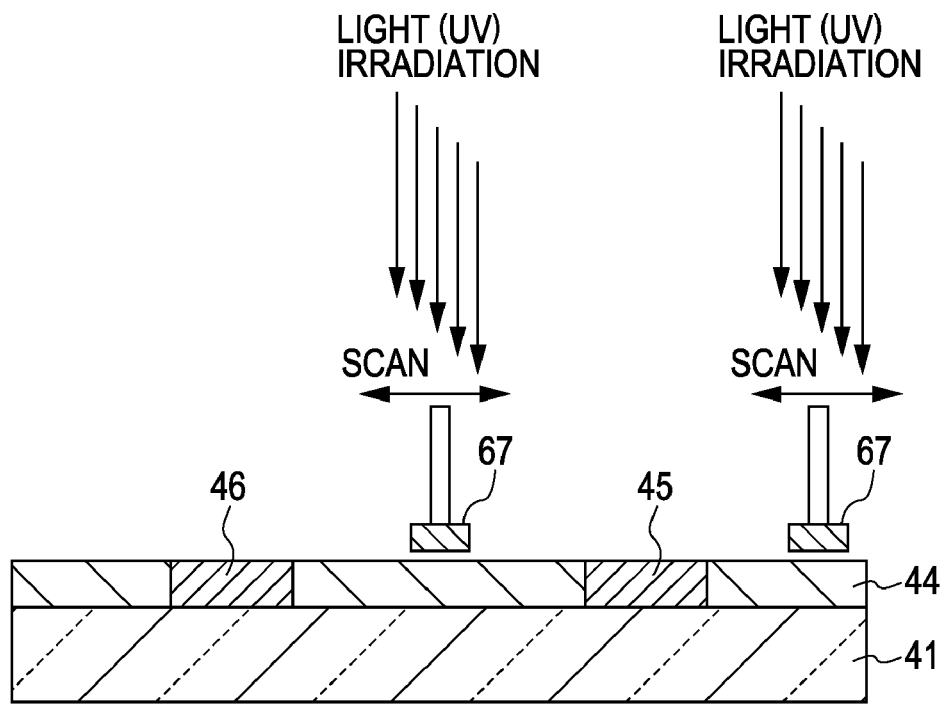
FIG. 6 is a schematic diagram for illustrating a method for fabricating an oxide-semiconductor device according to the Second Embodiment and EXAMPLES 8 and 9 of the present invention. A drain and a source are formed in an oxide semiconductor by scanning a powder photocatalyst and light irradiation.

When the oxide semiconductor is oxidized by using a photocatalyst, as shown in FIG. 5, a photocatalyst mask 58 processed on a mask substrate 57 into a desired shape may be used. The photocatalyst mask 58 may be made of a material containing $TiO_2$ or another photocatalyst material such as ZnO. In addition, as shown in FIG. 6, a predetermined region of the oxide semiconductor where the conductivity is to be decreased may be formed into a desired shape by bringing a powder photocatalyst 67 into contact or contiguity with the predetermined region of the oxide semiconductor and scanning the powder photocatalyst 67 under light irradiation. The irradiated light may be ultraviolet light. It is preferred that the primary component of the irradiated light has a wavelength equal to or shorter than the wavelength which is equivalent to the band-gap energy of the photocatalyst.

The oxide semiconductor in the region between the drain 45 and the source 46, of which the conductivity is decreased by the photocatalyst, is used as the channel layer 44 of the FET. Then, a gate-insulating film 43 is deposited on the channel layer 44. The gate-insulating film 43 may be formed of a film containing a silicon oxide or nitride such as $SiO_2$, $SiN_x$, or $SiO_xN_y$; a metal oxide such as $Al_2O_3$, $TiO_2$, $ZrO_2$, $HfO_2$, $Nb_2O_5$, $Ta_2O_5$, $Sc_2O_3$, $Y_2O_3$; or a rare-earth metal oxide.

A gate electrode 42 may be formed on the gate-insulating film 43. In order to readily achieve wiring and probe contacting, a drain electrode and a source electrode which are connected to the drain 45 and the source 46, respectively, may be formed on the drain and the source, respectively. These electrodes may be formed of a metal film such as Au or Al or a conductive oxide film such as Sn-doped $In_2O_3$ (ITO). In addition, a semiconductor such as highly doped polysilicon may be used.

Thus, a device using an oxide semiconductor, in particular, an FET using an oxide semiconductor as a channel, which has high quality and high performance, can be provided at low cost by fabricating the device according to the Second Embodiment of the present invention.

The present invention will now be described in detail with reference to EXAMPLES, but not limited to the following EXAMPLES.

EXAMPLES

Example 1

A method for fabricating an FET of EXAMPLE 1 will now be described with reference to FIG. 1.

The FET fabricated in EXAMPLE 1 includes a substrate 11, a channel layer 14 disposed on the substrate 11, a gate-insulating film 13 on the channel layer 14, a gate electrode 12 on the gate-insulating film 13, a drain 15, and a source 16. The drain 15 and the source 16 are formed by increasing the conductivity of the channel layer 14 at both sides of the gate-insulating film 13. The substrate 11 is made of an insulative material. For example, a glass substrate can be used. In addition, an FET can be fabricated on a flexible substrate by using an organic material such as polyethylene terephthalate (PET) or a polymer material as the substrate 11.

Specifically, a film as a channel layer 14 is formed on a substrate 11 by sputtering an oxide semiconductor InGaZnO so as to have a film thickness of about 50 nm. The InGaZnO is amorphous and has a composition ratio In:Ga:Zn:O=1:1:1:4. The sputtering is conducted under the conditions of a substrate temperature of room temperature, a substrate bias voltage of –10 V, a power of 300 W, an atmosphere of argon gas of 44 sccm and oxygen gas of 1.6 sccm, and a pressure of 0.533 Pa. The thickness of the layer may be in the range of 10 nm to 2000 nm, for example.

Then, a drain 15 and a source 16 are formed on the channel layer 14 by irradiating the channel layer 14 with an X-ray. The patterns of the drain 15 and the source 16 are formed by using a mask substrate 17 and a mask 18. The mask substrate 17 is made of an X-ray-transmitting material such as glass. The mask 18 is made of an X-ray-shielding heavy metal such as lead. A Rh target is used as the X-ray source.

Then, a film of $Y_2O_3$ as a gate-insulating film 13 is formed on the channel layer 14 by sputtering so as to have a film thickness of about 140 nm. The gate-insulating film 13 is patterned by lift-off using photolithography.

Instead of the lift-off, dry etching or wet etching may be conducted. The sputtering is conducted under the conditions of a substrate temperature of room temperature, a substrate bias voltage of –30 V, a power of 500 W, an atmosphere of argon gas of 13 sccm and oxygen gas of 20 sccm, and a pressure of 0.667 Pa. The thickness of the $Y_2O_3$ film, for example, may be in the range of 50 nm to 3000 nm. The gate-insulating film 13 may be formed of $SiO_2$, $Al_2O_3$, $HfO_2$, $ZrO_2$, $TiO_2$, $Nb_2O_3$, or $Ta_2O_3$, for example.

Then, a film of Au as a gate electrode 12 is formed on the gate-insulating film 13 by vacuum metallizing so as to have a film thickness of about 50 nm. The gate electrode 12 is patterned by lift-off using photolithography. Instead of the lift-off, dry etching or wet etching may be conducted. The gate electrode 12 may be made of Al, Pt, or InSnO (generally referred to as ITO).

The process for forming the drain 15 and the source 16, namely, the irradiation of the channel layer 14 with the X-ray, may be conducted after the formation of the gate-insulating film 13 or after the formation of both the gate-insulating film 13 and the gate electrode 12.

Example 2

A method for fabricating an FET of EXAMPLE 2 will now be described with reference to FIG. 2.

The FET fabricated in EXAMPLE 2 includes a substrate 21, a channel layer 24 disposed on the substrate 21, a gate-insulating film 23 on the channel layer 24, a gate electrode 22 on the gate-insulating film 23, a drain 25, and a source 26. The drain 25 and the source 26 are formed by increasing the conductivity of the channel layer 24 at both sides of the gate-insulating film 23. The substrate 21 is made of an insulative material, and may be a glass substrate, for example. In addition, an FET can be fabricated on a flexible substrate by using an organic material such as polyethylene terephthalate (PET) or a polymer material as the substrate 21.

Specifically, a film as a channel layer 24 is formed on a substrate 21 by sputtering an oxide semiconductor InGaZnO so as to have a film thickness of about 50 nm. The InGaZnO is amorphous and has a composition ratio In:Ga:Zn:O=1:1:1:4. The sputtering is conducted under the conditions of a substrate temperature of room temperature, a substrate bias voltage of –10 V, a power of 300 W, an atmosphere of argon gas of 44 sccm and oxygen gas of 1.6 sccm, and a pressure of 0.533 Pa. The thickness of the layer may be in the range of 10 nm to 2000 nm, for example.

Then, a film of $Y_2O_3$ as a gate-insulating film 23 is formed on the channel layer 24 by sputtering so as to have a film thickness of about 140 nm. The gate-insulating film 23 is patterned by lift-off using photolithography. Instead of the lift-off, dry etching or wet etching may be conducted. The sputtering is conducted under the conditions of a substrate temperature of room temperature, a substrate bias voltage of –30 V, a power of 500 W, an atmosphere of argon gas of 13 sccm and oxygen gas of 20 sccm, and a pressure of 0.667 Pa. The thickness of the $Y_2O_3$ film, for example, may be in the range of 50 nm to 3000 nm. The gate-insulating film 23 may be formed of $SiO_2$, $Al_2O_3$, $HfO_2$, $ZrO_2$, $TiO_2$, $Nb_2O_3$, or $Ta_2O_3$, for example.

Then, a film of Au as a gate electrode 22 is formed on the gate-insulating film 23 by vacuum metallizing so as to have a film thickness of about 50 nm. The gate electrode 22 is patterned by lift-off using photolithography. Instead of the lift-off, dry etching or wet etching may be conducted. The gate electrode 22 may be made of Al, Pt, or ITO, for example.

Lastly, a drain 25 and a source 26 are formed by irradiating the whole surface with an X-ray. Since the gate electrode 22 and the gate-insulating film 23 absorb the X-ray, the drain 25 and the source 26 are patterned on the channel layer 24 in only regions where the gate electrode 22 and the gate-insulating film 23 are not disposed.

Thus, in EXAMPLE 2, the FET can be fabricated without using a mask, unlike the method in EXAMPLE 1. In addition, since the X-ray irradiation is conducted after the formation of the gate-insulating film 23, the interface between the channel layer 24 and the gate-insulating film 23 is not degraded by the X-ray irradiation.

Example 3

A method for fabricating an FET of EXAMPLE 3 will now be described with reference to FIG. 2.

The FET in EXAMPLE 3 has a similar structure to that of the FET in EXAMPLE 2. The gate electrode is formed of a film having the same constitution as that of the channel layer and the conductivity of which is increased by the X-ray irradiation. The substrate 21 is made of an insulative material. For example, a glass substrate can be used. In addition, the FET can be fabricated on a flexible substrate by using an organic material such as polyethylene terephthalate (PET) or a polymer material as the substrate 21.

Specifically, a film as a channel layer 24 is formed on a substrate 21 by sputtering an oxide semiconductor InGaZnO so as to have a film thickness of about 50 nm. The InGaZnO is amorphous and has a composition ratio In:Ga:Zn:O=1:1:1:4. The sputtering is conducted under the conditions of a substrate temperature of room temperature, a substrate bias voltage of −10 V, a power of 300 W, an atmosphere of argon gas of 44 sccm and oxygen gas of 1.6 sccm, and a pressure of 0.533 Pa. The thickness of the layer may be in the range of 10 nm to 2000 nm, for example.

Then, a film of $Y_2O_3$ as a gate-insulating film 23 is formed on the channel layer 24 by sputtering so as to have a film thickness of about 140 nm. The gate-insulating film 23 is patterned by lift-off using photolithography. Instead of the lift-off, dry etching or wet etching may be conducted. The sputtering is conducted under the conditions of a substrate temperature of room temperature, a substrate bias voltage of −30 V, a power of 500 W, an atmosphere of argon gas of 13 sccm and oxygen gas of 20 sccm, and a pressure of 0.667 Pa. The thickness of the $Y_2O_3$ film, for example, may be in the range of 50 nm to 3000 nm. The gate-insulating film 23 may be formed of $SiO_2$, $Al_2O_3$, $HfO_2$, $ZrO_2$, $TiO_2$, $Nb_2O_3$, or $Ta_2O_3$, for example.

Then, a gate electrode 22 is formed on the gate-insulating film 23 by sputtering an oxide semiconductor InGaZnO so as to have a thickness of about 50 nm. The InGaZnO is amorphous and has a composition ratio In:Ga:Zn:O=1:1:1:4. The sputtering is conducted under the conditions of a substrate temperature of room temperature, a substrate bias voltage of −10 V, a power of 300 W, an atmosphere of argon gas of 44 sccm and oxygen gas of 1.6 sccm, and a pressure of 0.533 Pa. The thickness of the layer may be in the range of 10 nm to 2000 nm, for example. The gate electrode 22 is patterned by lift-off using photolithography. Instead of the lift-off, dry etching or wet etching may be conducted.

Lastly, the whole surface is irradiated with an X-ray to form a drain 25 and a source 26 and to increase the conductivity of the gate electrode 22. Since the gate-insulating film 23 absorbs the X-ray, the drain 25 and the source 26 are patterned on the channel layer 24 in the regions where the gate electrode 22 and the gate-insulating film 23 are not disposed.

Thus, in EXAMPLE 3, the FET can be fabricated without using a mask, like the method in EXAMPLE 2. In addition, since the X-ray irradiation is conducted after the formation of the gate-insulating film 23, the interface between the channel layer 24 and the gate-insulating film 23 is not degraded by the X-ray irradiation. Furthermore, all the channel layer 24, the drain 25, the source 26, and the gate electrode 22 are formed of the same material, and thereby the cost can be reduced.

Example 4

A method for fabricating an FET of EXAMPLE 4 will now be described with reference to FIG. 3.

The FET in EXAMPLE 4 has a similar structure to that of the FET in EXAMPLE 2. A drain and a source are formed on a channel layer by electron-beam lithography. A substrate 31 is made of an insulative material. For example, a glass substrate can be used. In addition, the FET can be fabricated on a flexible substrate by using an organic material such as polyethylene terephthalate (PET) or a polymer material as the substrate 31.

Specifically, a film as a channel layer 34 is formed on a substrate 31 by sputtering an oxide semiconductor InGaZnO so as to have a film thickness of about 50 nm. The InGaZnO is amorphous and has a composition ratio In:Ga:Zn:O=1:1:1:4. The sputtering is conducted under the conditions of a substrate temperature of room temperature, a substrate bias voltage of −10 V, a power of 300 W, an atmosphere of argon gas of 44 sccm and oxygen gas of 1.6 sccm, and a pressure of 0.533 Pa. The thickness of the layer may be in the range of 10 nm to 2000 nm, for example.

Then, a film of $Y_2O_3$ as a gate-insulating film 33 is formed on the channel layer 34 by sputtering so as to have a film thickness of about 140 nm. The gate-insulating film 33 is patterned by lift-off using photolithography. Instead of the lift-off, dry etching or wet etching may be conducted. The sputtering is conducted under the conditions of a substrate temperature of room temperature, a substrate bias voltage of −30 V, a power of 500 W, an atmosphere of argon gas of 13 sccm and oxygen gas of 20 sccm, and a pressure of 0.667 Pa. The thickness of the $Y_2O_3$ film, for example, may be in the range of 50 nm to 3000 nm. The gate-insulating film 33 may be formed of $SiO_2$, $Al_2O_3$, $HfO_2$, $ZrO_2$, $TiO_2$, $Nb_2O_3$, or $Ta_2O_3$, for example.

Then, a film of Au as a gate electrode 32 is formed on the gate-insulating film 33 by vacuum metallizing so as to have a film thickness of about 50 nm. The gate electrode 32 is patterned by lift-off using photolithography. Instead of the lift-off, dry etching or wet etching may be conducted. The gate electrode 32 may be made of Al, Pt, or InSnO (ITO).

Lastly, a drain 35 and a source 36 are formed by electron-beam lithography using an electron-beam (EB) gun 37.

Thus, in EXAMPLE 4, since the electron-beam lithography is conducted after the formation of the gate-insulating film 33, the interface between the channel layer 34 and the gate-insulating film 33 is not degraded by the electron-beam lithography.

Example 5

A method for fabricating an FET of EXAMPLE 5 will now be described with reference to FIG. 3.

The FET in EXAMPLE 5 has a similar structure to that of the FET in EXAMPLE 2. The gate electrode is formed of a film having the same constitution as that of the channel layer. The conductivity of the gate electrode is increased by electron-beam lithography. The substrate 31 is made of an insulative material. For example, a glass substrate can be used. In addition, the FET can be fabricated on a flexible substrate by using an organic material such as polyethylene terephthalate (PET) or a polymer material as the substrate 31.

Specifically, a film as a channel layer 34 is formed on a substrate 31 by sputtering an oxide semiconductor InGaZnO so as to have a film thickness of about 50 nm. The InGaZnO is amorphous and has a composition ratio In:Ga:Zn:O=1:1:1:4. The sputtering is conducted under the conditions of a substrate temperature of room temperature, a substrate bias voltage of −10 V, a power of 300 W, an atmosphere of argon gas of 44 sccm and oxygen gas of 1.6 sccm, and a pressure of 0.533 Pa. The thickness of the layer may be in the range of 10 nm to 2000 nm, for example.

Then, a film of $Y_2O_3$ as a gate-insulating film 33 is formed on the channel layer 34 by sputtering so as to have a film thickness of about 140 nm. The gate-insulating film 33 is patterned by lift-off using photolithography. Instead of the lift-off, dry etching or wet etching may be conducted. The sputtering is conducted under the conditions of a substrate temperature of room temperature, a substrate bias voltage of −30 V, a power of 500 W, an atmosphere of argon gas of 13 sccm and oxygen gas of 20 sccm, and a pressure of 0.667 Pa. The thickness of the $Y_2O_3$ film, for example, may be in the range of 50 nm to 3000 nm. The gate-insulating film 33 may be formed of $SiO_2$, $Al_2O_3$, $HfO_2$, $ZrO_2$, $TiO_2$, $Nb_2O_3$, or $Ta_2O_3$, for example.

Then, a gate electrode 32 is formed on the gate-insulating film 33 by sputtering an oxide semiconductor InGaZnO so as to have a thickness of about 50 nm. The InGaZnO is amorphous and has a composition ratio In:Ga:Zn:O=1:1:1:4. The sputtering is conducted under the conditions of a substrate temperature of room temperature, a substrate bias voltage of −10 V, a power of 300 W, an atmosphere of argon gas of 44 sccm and oxygen gas of 1.6 sccm, and a pressure of 0.533 Pa. The thickness of the layer may be in the range of 10 nm to 2000 nm, for example. The gate electrode 32 is patterned by lift-off using photolithography. Instead of the lift-off, dry etching or wet etching may be conducted.

Lastly, a drain 35, a source 36, and a gate electrode 32 are formed by electron-beam lithography using an EB gun 37.

Thus, in EXAMPLE 5, since the electron-beam lithography is conducted after the formation of the gate-insulating film 33, the interface between the channel layer 34 and the gate-insulating film 33 is not degraded by the electron-beam lithography. In addition, all the channel layer 34, the drain 35, the source 36, and the gate electrode 32 are formed of the same material, and thereby the cost can be reduced.

Example 6

A method for fabricating an FET of EXAMPLE 6 will now be described with reference to FIGS. 4 and 5.

The FET of EXAMPLE 6 has a structure including a channel layer 44 on a substrate 41. The substrate 41 is made of an insulative material. For example, a glass substrate can be used. In addition, the FET can be fabricated on a flexible substrate by using an organic material such as polyethylene terephthalate (PET) or a polymer material as the substrate 41.

Specifically, a film as a channel layer 44 is formed on a substrate 41 by sputtering an oxide semiconductor InGaZnO so as to have a film thickness of about 50 nm. The InGaZnO is amorphous and has a composition ratio In:Ga:Zn:O=1:1:1:4. The sputtering is conducted under the conditions of a substrate temperature of room temperature, a substrate bias voltage of −10 V, a power of 300 W, an atmosphere of argon gas of 44 sccm and oxygen gas of 0.2 sccm, and a pressure of 0.533 Pa. The thickness of the layer may be in the range of 10 nm to 2000 nm, for example.

Then, as shown in FIG. 5, the conductivity of the channel layer 44 is decreased in the region where a drain 45 and a source 46 are not to be formed. The conductivity is decreased using a photocatalyst under light irradiation with a mask substrate 57 and a photocatalyst mask 58. The light irradiation is conducted with the photocatalyst mask 58 in contact with the oxide semiconductor. The mask substrate 57 is made of quartz, which readily transmits ultraviolet light. As the photocatalyst mask material, anatase-type titanium oxide is used. An ultrahigh pressure mercury lamp is used as the source of the irradiated light. The primary component of the irradiated light has a wavelength of 289 nm being equivalent to or higher than the band-gap energy, about 3 eV, of titanium oxide.

Then, a gate-insulating film 43 and a gate electrode 42 are formed on the channel of the FET in the region having the decreased conductivity and being between the drain 45 and the source 46.

Then, a film of $Y_2O_3$ as a gate-insulating film 43 is formed by sputtering so as to have a film thickness of about 140 nm. The gate-insulating film 43 is patterned by lift-off using photolithography. Instead of the lift-off, dry etching or wet etching may be conducted. The sputtering is conducted under the conditions of a substrate temperature of room temperature, a substrate bias voltage of −30 V, a power of 500 W, an atmosphere of argon gas of 13 sccm and oxygen gas of 20 sccm, and a pressure of 0.667 Pa. The thickness of the $Y_2O_3$ film, for example, may be in the range of 50 nm to 3000 nm. The gate-insulating film 43 may be formed of $SiO_2$, $Al_2O_3$, $HfO_2$, $ZrO_2$, $TiO_2$, $Nb_2O_3$, or $Ta_2O_3$, for example.

Then, a film of Au as a gate electrode 42 is formed on the gate-insulating film 43 by vacuum metallizing so as to have a film thickness of about 50 nm. The gate electrode 42 is patterned by lift-off using photolithography. Instead of the lift-off, dry etching or wet etching may be conducted. The gate electrode 42 may be made of Al, Pt, or InSnO (ITO), for example.

Thus, an FET having a favorable channel/insulating layer interface can be fabricated.

Example 7

A method for fabricating an FET of EXAMPLE 7 will now be described with reference to FIGS. 7 and 5.

Figure 7:
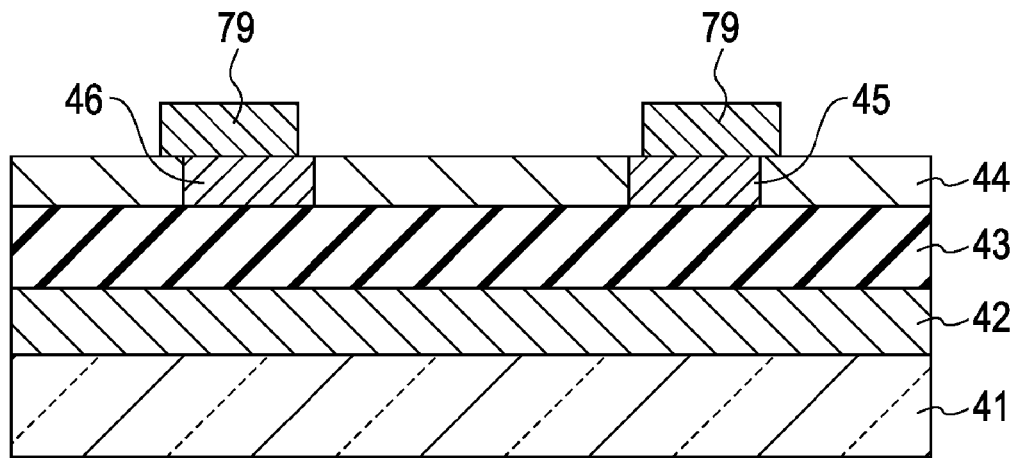
FIG. 7 is a schematic diagram of a bottom-gate thin-film transistor for illustrating a method for fabricating an oxide-semiconductor device according to the Second Embodiment and EXAMPLES 7 and 9 of the present invention.
Figure 8:
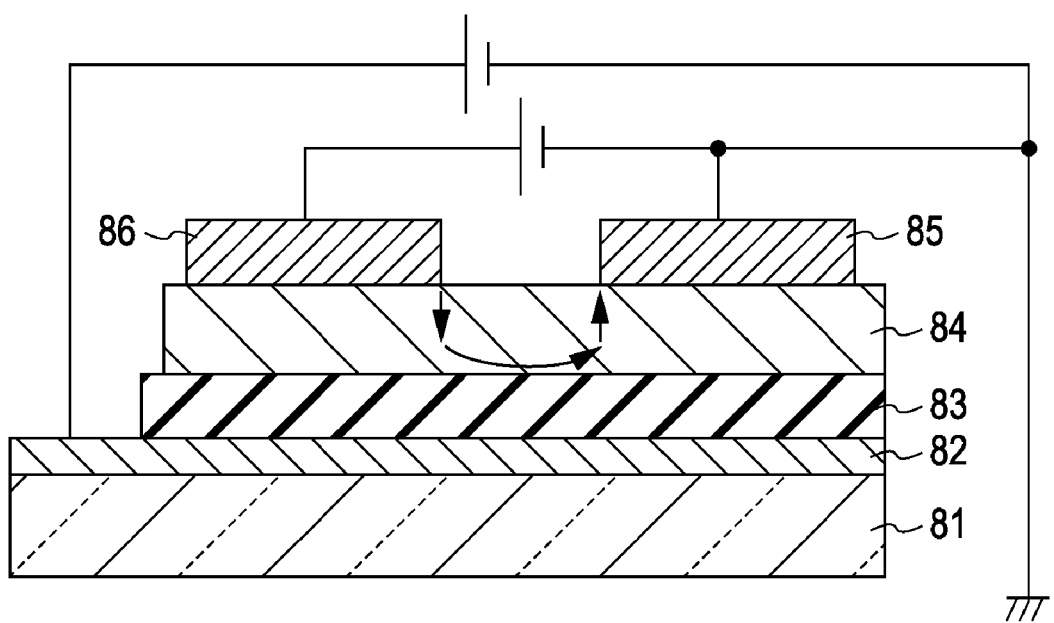
FIG. 8 is a schematic diagram of a known inverted-staggered (bottom-gate) thin-film transistor.
Figure 9:
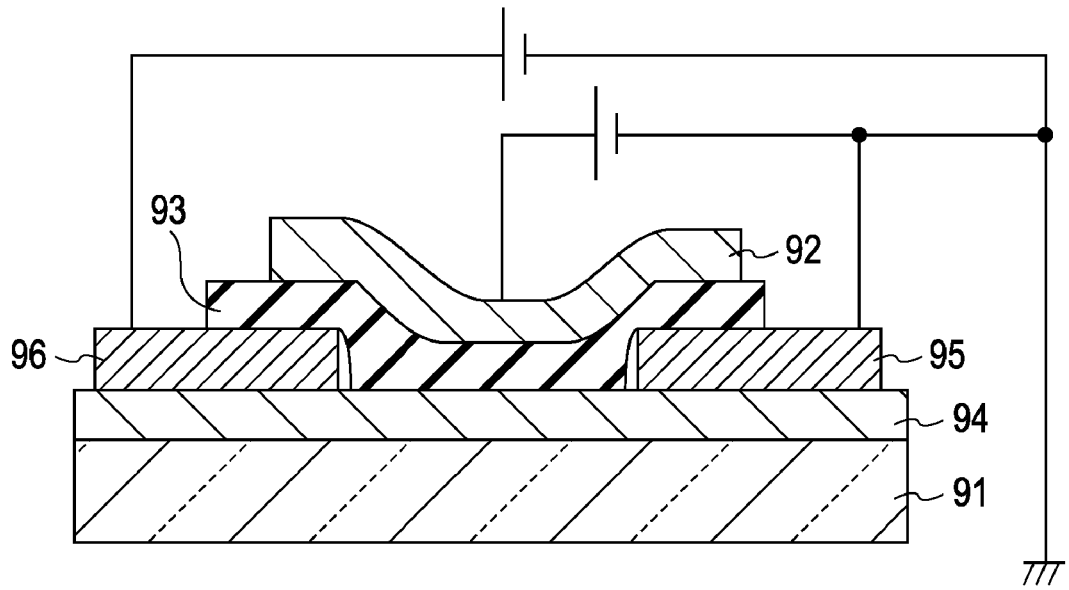
FIG. 9 is a schematic diagram of a known staggered (top-gate) thin-film transistor.
Figure 10:
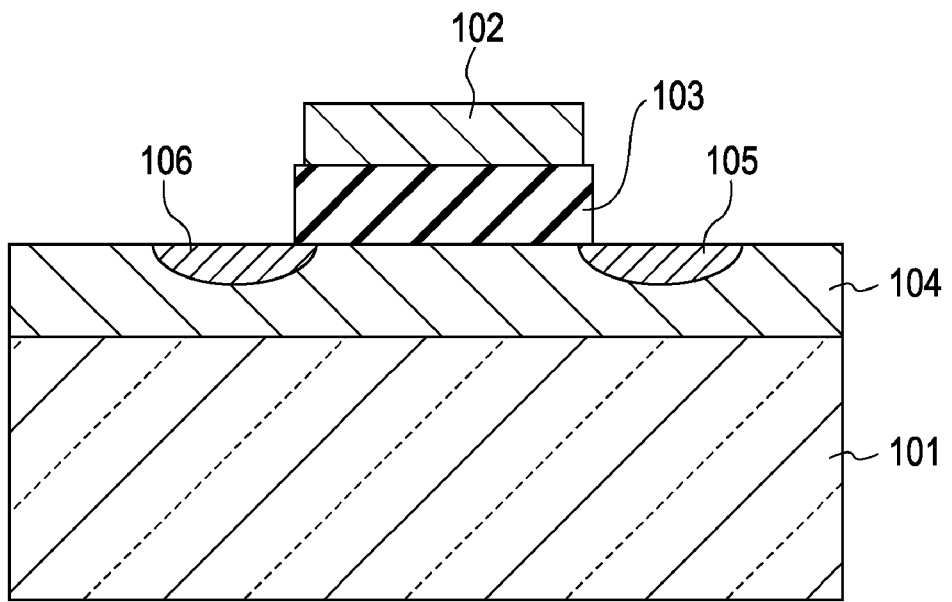
FIG. 10 is a schematic diagram of a thin-film transistor having a drain and a source in a conventional channel layer.

The FET of EXAMPLE 7 is a bottom-gate type TFT as shown in FIG. 7. A substrate 41 is made of an insulative material. For example, a glass substrate can be used. In addition, the FET can be fabricated on a flexible substrate by using an organic material such as polyethylene terephthalate (PET) or a polymer material as the substrate 41.

Specifically, as shown in FIG. 7, an ITO film as a gate electrode 42 is formed on a substrate 41 by magnetron sputtering using a target comprising $In_2O_3$ (95 mol %) and $SnO_2$ (5 mol %) so as to have a film thickness of about 150 nm. The gate electrode 42 may be formed of another conductive oxide such as ZnO:Al or $SnO_2$:F; a metal such as Au, Pt, or Al; or a semiconductor such as a highly doped polysilicon.

Then, a film of $Y_2O_3$ as a gate-insulating film 43 is formed on the gate electrode 42 by sputtering so as to have a film thickness of about 140 nm. The sputtering is conducted under the conditions of a substrate temperature of room temperature, a substrate bias voltage of −30 V, a power of 500 W, an atmosphere of argon gas of 13 sccm and oxygen gas of 20 sccm, and a pressure of 0.667 Pa. The thickness of the $Y_2O_3$ film, for example, may be in the range of 50 nm to 3000 nm. The gate-insulating film 43 may be formed of $SiO_2$, $Al_2O_3$, $HfO_2$, $ZrO_2$, $TiO_2$, $Nb_2O_3$, or $Ta_2O_3$, for example.

Here, the gate electrode 42 and the gate-insulating film 43 may be each processed into a predetermined shape, if necessary. The patterning is conducted by lift-off using photolithography. Instead of the lift-off, dry etching or wet etching may be conducted.

Then, a film as a channel layer 44 is formed on the gate-insulating film 43 by sputtering an oxide semiconductor InGaZnO so as to have a film thickness of about 50 nm. The InGaZnO is amorphous and has a composition ratio In:Ga:Zn:O=1:1:1:4. The sputtering is conducted under the conditions of a substrate temperature of room temperature, a substrate bias voltage of −10 V, a power of 300 W, an atmosphere of argon gas of 44 sccm and oxygen gas of 0.2 sccm, and a pressure of 0.533 Pa. The thickness of the layer may be in the range of 10 nm to 2000 nm, for example.

Then, similarly to the process shown in FIG. 5, the conductivity of the channel layer 44 is decreased in the region where a drain 45 and a source 46 are not to be formed. The conductivity is decreased using a photocatalyst under light irradiation with a mask substrate 57 and a photocatalyst mask 58. The light irradiation is conducted with the photocatalyst mask 58 in contact with the oxide semiconductor. The mask substrate 57 is made of quartz, which readily transmits ultraviolet light. As the photocatalyst mask material, anatase-type titanium oxide is used. An ultrahigh pressure mercury lamp is used as the source of the irradiated light. The primary component of the irradiated light has a wavelength of 289 nm being equivalent to or higher than the band-gap energy, about 3 eV, of titanium oxide.

Then, the region having the decreased conductivity and being between the drain 45 and the source 46 serves as the channel of the FET. Here, as shown in FIG. 7, electrodes 79 may be formed on the drain 45 and the source 46 for readily achieving wiring and contacting of the drain 45 and the source 46 with electric circuits.

Thus, an FET having a favorable channel/insulating layer interface can be fabricated.

Example 8

A method for fabricating an FET of EXAMPLE 8 will now be described with reference to FIGS. 4 and 6.

The FET of EXAMPLE 8 has a structure similar to that of the FET in EXAMPLE 1. A channel layer 44 is disposed on a substrate 41 made of an insulative material. For example, a glass substrate can be used. In addition, the FET can be fabricated on a flexible substrate by using an organic material such as polyethylene terephthalate (PET) or a polymer material as the substrate 41.

Specifically, a film as a channel layer 44 is formed on a substrate 41 by sputtering an oxide semiconductor InGaZnO so as to have a film thickness of about 50 nm. The InGaZnO is amorphous and has a composition ratio In:Ga:Zn:O=1:1:1:4. The sputtering is conducted under the conditions of a substrate temperature of room temperature, a substrate bias voltage of $-10$ V, a power of 300 W, an atmosphere of argon gas of 44 sccm and oxygen gas of 0.2 sccm, and a pressure of 0.533 Pa. The thickness of the layer may be in the range of 10 nm to 2000 nm, for example.

Then, as shown in FIG. 6, the conductivity of the channel layer 44 is decreased in the region other than regions where a drain 45 and a source 46 are to be formed, by a photocatalyst under light irradiation. The conductivity is decreased by bringing a powder photocatalyst 67 into contact with the oxide semiconductor and scanning the powder photocatalyst 67 under light irradiation. As the powder photocatalyst material, anatase-type titanium oxide is used. An ultrahigh pressure mercury lamp is used as the source of the irradiated light. The primary component of the irradiated light has a wavelength of 289 nm being equivalent to or higher than the band-gap energy, about 3 eV, of titanium oxide. Then, a gate-insulating film 43 and a gate electrode 42 are formed on the channel of the FET in the region having the decreased conductivity and being between the drain 45 and the source 46.

Then, a film of $Y_2O_3$ as a gate-insulating film 43 is formed by sputtering so as to have a film thickness of about 140 nm. The gate-insulating film 43 is patterned by lift-off using photolithography. Instead of the lift-off, dry etching or wet etching may be conducted. The sputtering is conducted under the conditions of a substrate temperature of room temperature, a substrate bias voltage of $-30$ V, a power of 500 W, an atmosphere of argon gas of 13 sccm and oxygen gas of 20 sccm, and a pressure of 0.667 Pa. The thickness of the $Y_2O_3$ film, for example, may be in the range of 50 nm to 3000 nm. The gate-insulating film 43 may be formed of $SiO_2$, $Al_2O_3$, $HfO_2$, $ZrO_2$, $TiO_2$, $Nb_2O_3$, or $Ta_2O_3$, for example.

Then, a film of Au as a gate electrode 42 is formed on the gate-insulating film 43 by vacuum metallizing so as to have a film thickness of about 50 nm. The gate electrode 42 is patterned by lift-off using photolithography. Instead of the lift-off, dry etching or wet etching may be conducted. The gate electrode 42 may be made of Al, Pt, or InSnO (ITO), for example.

Thus, an FET having a favorable channel/insulating layer interface can be fabricated.

Example 9

A method for fabricating an FET of EXAMPLE 9 will now be described with reference to FIGS. 4, 6, and 7.

The FET of EXAMPLE 9 is a bottom-gate type TFT as shown in FIG. 7. A substrate 41 is made of an insulative material. For example, a glass substrate can be used. In addition, the FET can be fabricated on a flexible substrate by using an organic material such as polyethylene terephthalate (PET) or a polymer material as the substrate 41.

Specifically, as shown in FIG. 7, an ITO film as a gate electrode 42 is formed on a substrate 41 by magnetron sputtering using a target comprising $In_2O_3$ (95 mol %) and $SnO_2$ (5 mol %) so as to have a film thickness of about 150 nm. The gate electrode 42 may be formed of another conductive oxide such as ZnO:Al or $SnO_2$:F; a metal such as Au, Pt, or Al; or a semiconductor such as a highly doped polysilicon.

Then, a film of $Y_2O_3$ as a gate-insulating film 43 is formed on the gate electrode 42 by sputtering so as to have a film thickness of about 140 nm. The sputtering is conducted under the conditions of a substrate temperature of room temperature, a substrate bias voltage of $-30$ V, a power of 500 W, an atmosphere of argon gas of 13 sccm and oxygen gas of 20 sccm, and a pressure of 0.667 Pa. The thickness of the $Y_2O_3$ film, for example, may be in the range of 50 nm to 3000 nm. The gate-insulating film 43 may be formed of $SiO_2$, $Al_2O_3$, $HfO_2$, $ZrO_2$, $TiO_2$, $Nb_2O_3$, or $Ta_2O_3$, for example.

Here, the gate electrode 42 and the gate-insulating film 43 may be each processed into a predetermined shape, if necessary. The patterning is conducted by lift-off using photolithography. Instead of the lift-off, dry etching or wet etching may be conducted.

Then, a film as a channel layer 44 is formed on the gate-insulating film 43 by sputtering an oxide semiconductor InGaZnO so as to have a film thickness of about 50 nm. The InGaZnO is amorphous and has a composition ratio In:Ga:Zn:O=1:1:1:4. The sputtering is conducted under the conditions of a substrate temperature of room temperature, a substrate bias voltage of $-10$ V, a power of 300 W, an atmosphere of argon gas of 44 sccm and oxygen gas of 0.2 sccm, and a pressure of 0.533 Pa. The thickness of the layer may be in the range of 10 nm to 2000 nm, for example.

Then, according to the same process as that shown in FIG. 6, the conductivity of the channel layer 44 is decreased in the region where a drain 45 and a source 46 are not to be formed. The conductivity is decreased by bringing a powder photocatalyst 67 into contact with the oxide semiconductor and scanning the powder photocatalyst 67 under light irradiation. As the powder photocatalyst material, anatase-type titanium oxide is used. An ultrahigh pressure mercury lamp is used as the source of the irradiated light. The primary component of the irradiated light has a wavelength of 289 nm being equivalent to or higher than the band-gap energy, about 3 eV, of titanium oxide.

Then, the region having the decreased conductivity and being between the drain 45 and the source 46 serves as the channel of the FET. Here, as shown in FIG. 7, electrodes 79 may be formed on the drain 45 and the source 46 for readily achieving wiring and contacting of the drain 45 and the source 46 with electric circuits.

Thus, an FET having a favorable channel/insulating layer interface can be fabricated.

The process of changing the conductivity of a predetermined region of the oxide semiconductor may be conducted by the following method: an organic material, nitride, fluoride, or a metal as a mask is annealed and heated to 100° C. or more in an oxidation atmosphere or a reduction atmosphere; and then the mask is removed.

In each of the above-mentioned EXAMPLES for describing the present invention, an amorphous oxide containing In, Ga, and Zn is used, but an amorphous oxide containing at least one of Sn, In, and Zn can be used.

Furthermore, when the amorphous oxide contains Sn as one constituent, the Sn can be substituted with $Sn_{1-x}M4_x$ (wherein $0<x<1$, and M4 is selected from a Group 4 element Si, Ge, and Zr which have an atomic number less than that of Sn).

When the amorphous oxide contains In as one constituent, the In can be substituted with $In_{1-y}M3_y$ (wherein $0<y<1$, and M3 is Lu or is selected from a Group 3 element B, Al, Ga, and Y which have an atomic number less than that of In).

When the amorphous oxide contains Zn as one constituent, the Zn can be substituted with $Zn_{1-z}M2_z$ (wherein $0<z<1$, and M2 is selected from a Group 2 element Mg and Ca which have an atomic number less than that of Zn).

Examples of the amorphous oxide which can be applied to the present invention include Sn—In—Zn oxides, In—Zn—Ga—Mg oxides, In oxides, In—Sn oxides, In—Ga oxides, In—Zn oxides, and Zn—Ga oxides. The composition ratio is not necessarily 1:1. It may be difficult to form an amorphous phase by Zn or Sn alone, but they can form an amorphous phase by the presence of In. For example, in an In—Zn system, a favorable composition contains about 20 at % or more of In as an atomic numeral ratio except for oxygen. In a Sn—In system, a favorable composition contains about 80 at % or more of In as an atomic numeral ratio except for oxygen. In a Sn—In—Zn system, a favorable composition contains about 15 at % or more of In as atomic numeral ratio except for oxygen.

The amorphous state of a thin film can be confirmed when no clear diffraction peak is observed (i.e., a halo pattern is observed) in the thin film in X-ray diffraction analysis at a small incident angle of about 0.5 degrees or less. However, when the above-mentioned material is used in a channel layer of a field-effect transistor, the channel layer may contain a microcrystalline material, and this is included in the scope of the present invention.

A device using an oxide semiconductor fabricated according to the present invention can be applied as a transparent device for a transparent display. In addition, the device can be applied as a switching device of a liquid crystal display (LCD) or an organic electroluminescence (EL) display, and can be widely applied to a flexible display and even to an IC card and an ID tag.

As described above, according to the method of fabricating an oxide semiconductor device such as an FET using an oxide semiconductor of the present invention, a high-quality and high-performance device can be fabricated at low cost. In particular, a remarkable effect can be achieved by applying the present invention to an FET using an oxide semiconductor as the channel layer. Thus, for example, a high-quality and high-performance transparent transistor can be fabricated at low cost and a high-quality and high-performance display can be obtained at low cost by using such a transistor.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-258268 filed Sep. 6, 2005, which is hereby incorporated by reference herein in its entirety.

What is claimed is:

1. A method for fabricating a device using an oxide semiconductor, the method comprising the steps of:
   forming the oxide semiconductor on a substrate; and
   changing the conductivity of the oxide semiconductor by irradiating a predetermined region of the oxide semiconductor with an energy ray;
   wherein the process of changing the conductivity of the oxide semiconductor comprises the steps of:
   bringing a photocatalyst into contact with the predetermined region of the oxide semiconductor; and
   decreasing the conductivity of the oxide semiconductor by irradiating the photocatalyst with light having an energy equal to or greater than the optical band-gap of the photocatalyst.

2. The method according to claim 1, wherein the device is an oxide-semiconductor channel field-effect transistor; and the region for decreasing the conductivity of the oxide semiconductor is a channel placed between a source and a drain of the field-effect transistor.

3. The method according to claim 1, wherein the irradiated light used for decreasing the conductivity of the oxide semiconductor is ultraviolet light.

4. The method according to claim 1, wherein the photocatalyst is a material containing titanium oxide.

5. The method according to claim 1, wherein the photocatalyst is a photocatalyst mask processed into a predetermined shape and disposed on the substrate.

6. The method according to claim 1, wherein the oxide semiconductor contains at least one element selected from zinc, indium, and gallium as a constituent element.

* * * * *